United States Patent
Romano et al.

(10) Patent No.: US 6,820,551 B1
(45) Date of Patent: Nov. 23, 2004

(54) METHOD AND SYSTEM FOR ELECTRONICALLY GENERATING EXPOSURE SCALE FOR LASER IMAGING DEVICES

(75) Inventors: David J. Romano, Sandown, NH (US); James Hebert, Derry, NH (US); James Francis, Lancaster, MA (US); Mark Bussard, Salem, MA (US)

(73) Assignee: Agfa Corporation, Wilmington, MA (US)

( * ) Notice: Subject to any disclaimer, the term of this patent is extended or adjusted under 35 U.S.C. 154(b) by 0 days.

(21) Appl. No.: 10/649,034

(22) Filed: Aug. 27, 2003

(51) Int. Cl.$^7$ ................................. B41N 3/00
(52) U.S. Cl. .................. 101/463.1; 101/467; 358/3.29; 430/204; 430/302
(58) Field of Search .............................. 101/463.1–467; 358/3.29; 430/204, 270.1, 300–302

(56) References Cited

U.S. PATENT DOCUMENTS

| | | | |
|---|---|---|---|
| 5,345,870 A | * | 9/1994 | Bailey et al. ............ 101/463.1 |
| 5,536,946 A | | 7/1996 | Vuylsteke |
| 5,649,260 A | | 7/1997 | Wheeler |
| 6,183,936 B1 | * | 2/2001 | Watkiss ...................... 430/302 |
| 6,219,154 B1 | | 4/2001 | Romano |
| 6,305,284 B1 | * | 10/2001 | Watanabe et al. ........ 101/463.1 |
| 2002/0108519 A1 | * | 8/2002 | Friedman .................... 101/467 |
| 2002/0196473 A1 | | 12/2002 | Patten |

* cited by examiner

*Primary Examiner*—Minh H Chau
(74) *Attorney, Agent, or Firm*—Grant Houston; Robert A. Sabourin

(57) ABSTRACT

A method for characterizing exposure levels in a platesetter comprises exposing regions of a plate at different exposure levels by modulating the power of an exposure beam and then analyzing the plate after development to determine a desired exposure level for plates on the platesetter by reference to the regions receiving the different exposure levels. The plates are preferably exposed in an area outside of a printing area. In this way, the exposure test can be performed as part of the normal plate printing process. The plate is not consumed. Moreover, the plate exposure setting can be constantly monitored throughout production in one implementation.

29 Claims, 6 Drawing Sheets

| INPUT VALUE | OUTPUT PERCENTAGE | LOG CHANGE IN EXPOSURE |
|---|---|---|
| 1 | 100% | 0 |
| 2 | 71% | .15 |
| 3 | 50% | .30 |
| 4 | 36% | .45 |
| 5 | 25% | .60 |
| 6 | 18% | .75 |
| 7 | 13% | .90 |
| 8 | 9% | 1.05 |

EXPOSURE MAP-PRINTER SETTINGS

FIG.4

METHOD AND SYSTEM FOR ELECTRONICALLY GENERATING EXPOSURE SCALE FOR LASER IMAGING DEVICES

BACKGROUND OF THE INVENTION

Imagesetters and platesetters are used to expose substrates, which are used in many conventional offset printing systems. Imagesetters are typically used to expose the film that is then used to make the plates for the printing system. Platesetters are used to directly expose the plates.

For example, plates are typically large substrates that have been coated with photosensitive or thermally-sensitive material layers, referred to the emulsion. For large run applications, the substrates are fabricated from aluminum, although organic substrates, such as polyester or paper, are also available for smaller runs.

Computer-to-plate printing systems are used to render digitally stored print content onto these printing plates. Typically, a computer system is used to drive an imaging engine of the platesetter. In a common implementation, the plate is fixed to the outside or inside of a drum and then scanned with a modulated laser source in a raster fashion.

The imaging engine selectively exposes the emulsion that is coated on the plates. After this exposure, the emulsion is developed so that, during the printing process, inks will selectively adhere to the plate's surface to transfer the ink to the print medium.

The imaging engines of these platesetters and/or imagesetters have imaging devices that generate powerful spatially and/or temporally modulated optical signals. These optical signals are used to expose the plate or film media held on the drum or flat bed. Typically, the media is held on a drum that is rotated underneath the imaging engine while the imaging engine is scanned axially along the drum to expose the media on the drum.

The process of exposing plates is basically a binary process. Where the plates are exposed, the ink either adheres or does not adhere, depending one the emulsion chemistry. As a result, grey images are generated by a halftoning process, in which dots of different sizes and/or densities are placed in order to get the desired color density when integrated by the human eye.

In negative-working plates, the exposure of the emulsion produces a dot through a photopolymerization process. Depending on whether the polymer is hydrophilic or hydrophobic, the ink then adheres to the dot or not in the subsequent offset printing process.

In contrast, in positive-working systems, the exposure of the emulsion causes the emulsion to be removed during the development process, leaving the exposed plate substrate, which is typically aluminum. Depending on the system, this exposed region of aluminum will either hold ink or not.

Even though the basic system is binary, exposure setting is critical. Exposure is set by the imaging engine of the platesetter or imagesetter. It is a function of the strength of the exposure beam and how long the exposure beam is resident at each pixel.

For example, under-exposure in a negative-working system will result in the generation of polymer dots that are insufficiently hard. As a result, they will not survive long in the offset printing machine, requiring the plates to be replaced frequently. On the other hand, over exposure will yield a dot that is too large, which will impact the balance of the color and non-colored areas in the final image.

The conventional process for setting exposure in the imaging engine involves the use of an analog wedge test target. This is attached to the plate, typically in a darkroom. The plate is then loaded into the imaging engine and exposed. Thereafter, the target is removed and the plate is developed. From analysis of the portion of the plate that was exposed through the step wedge, it is possible to determine the proper exposure setting for the imaging engine, as some fraction of the exposure beam's power during the exposure through the analog step wedge.

SUMMARY OF THE INVENTION

A number of problems exist with this conventional system. First, the attachment to the step wedge to the plate is a time consuming process that requires operator intervention. To address this, some have suggested step wedges that are flipped into the path of the exposure beam, between the source and the plate. This "mechanical solution" avoids the need for operator intervention. Nonetheless, both these solutions have further problems insofar as the process consumes a plate. This increases the cost of the test, which should be performed periodically to ensure that the power of the source is unchanged and that there have been no changes in the plate chemistry, due to ageing of the plate or the chemical used to develop the plate, for example.

In general, according to one aspect, the invention features a method for characterizing exposure levels in a platesetter. This method comprises exposing regions of a plate at different exposure levels by modulating the power of an exposure beam and then analyzing the plate after development to determine a desired exposure level for plates on the platesetter by reference to the regions receiving the different exposure levels.

The step of exposing the regions of the plate comprises exposing the plate in an area outside of a printing area. In this way, the exposure test can be performed as part of the normal plate printing process. The plate is not consumed. Moreover, the plate exposure setting can be constantly monitored throughout production, in one implementation.

In the preferred embodiment, the step of exposing regions of a plate comprises exposing the plate along a gripper edge, which is outside the printing area. This is typically an unused portion of the plate.

Further, the step of exposing regions of the plate comprises generating an exposure map. This map provides log changes in the exposure levels, by controlling a current to a laser, generating the exposure beam.

In other embodiments, where, for example, attenuators are located between the source and the media or plate, the exposure map is generated by controlling the attenuator. In other implementations, the step of generating the exposure map further comprises generating regions, including halftone patterns, at different exposure levels, to more fully test the various exposure settings.

In general, according to another aspect, the invention features an exposure characterization system for a platesetter. This system comprises an exposure beam generator for generating a modulated exposure beam for exposing a plate. A controller then controls the exposure beam to expose regions of the plate at different exposure levels by controlling a power of the exposure beam.

In the preferred embodiment, this system comprises an exposure map storage for storing exposure levels of an exposure map, defining the different exposure levels.

In general, according to still another aspect, the invention features a method for controlling plate exposure in a plate production line. This comprises exposing the regions of a plate at different exposure levels in areas outside of the printing areas of the plate. The plates are then analyzed after the development to determine desired exposure levels for the plates, on the platesetter, by reference to the regions receiving the different exposure levels. This information is then fed back as changes to the exposure level for the printing areas of the plate.

Finally, according to still another aspect, the invention features a plate exposure level control system. This comprises an exposure beam generator for generating a modulated exposure beam for exposing the plates, and a controller for controlling the exposure beam generator to expose regions of the plates at different exposure levels by controlling a power of the exposure beam. A post-development analyzer is provided for analyzing the plates after development to determine a desired exposure level for the plates on the platesetter, by reference to the regions receiving the different exposure levels and feeding back changes in the exposure level for the printing areas of the plates in the platesetter.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 4 is a matrix of exposure levels, which define an exemplary exposure map;

DETAILED DESCRIPTION OF THE PREFERRED EMBODIMENTS

Figure 1:
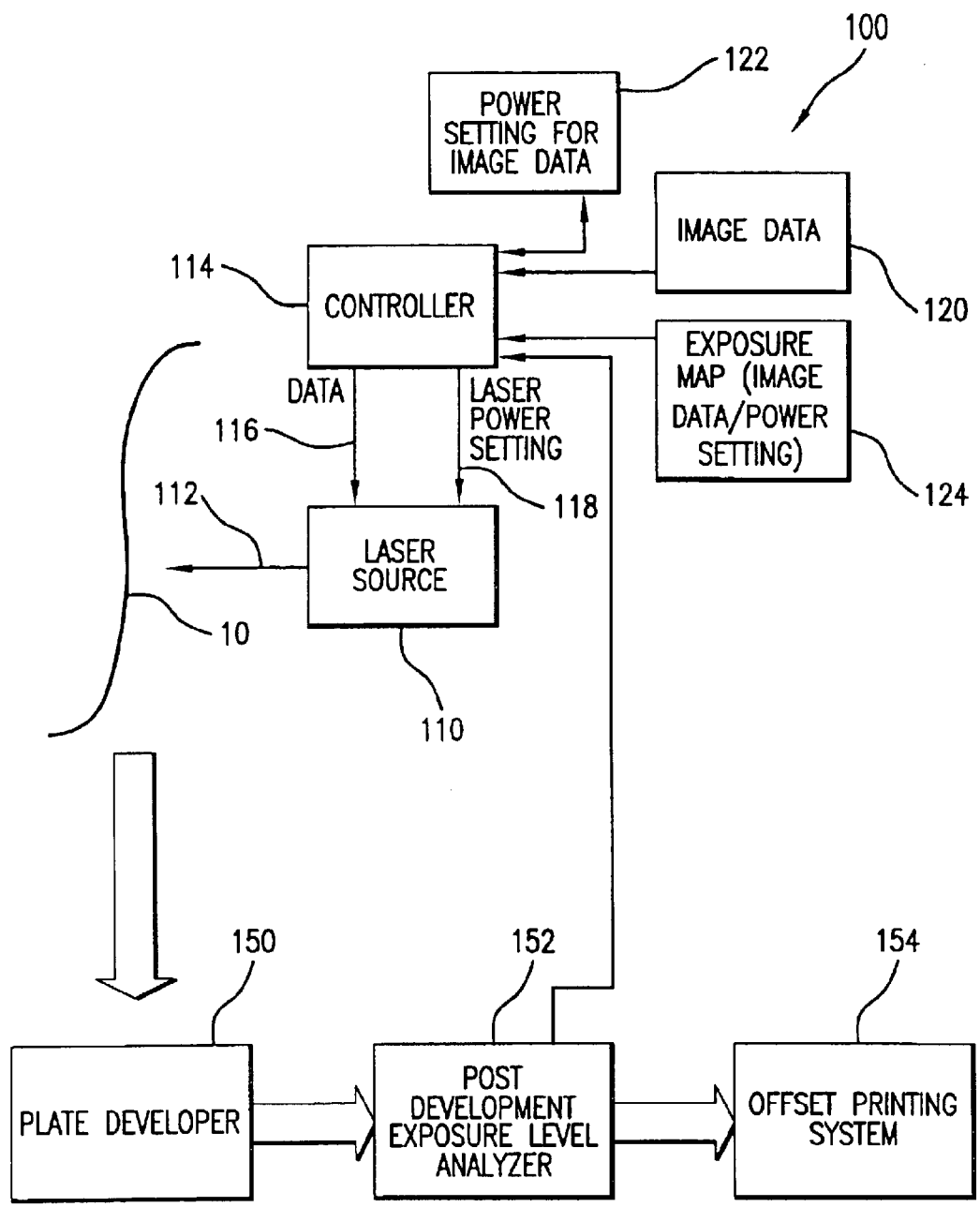
FIG. 1 is a schematic block diagram showing the imaging engine of a platesetter and the inventive plate exposure level control system.

FIG. 1 shows a platesetter imaging engine and a plate exposure level control system, which has been constructed according to the principles of the present invention.

In more detail, the platesetter, and specifically its imaging engine 100, comprises an exposure beam source 110. In the preferred embodiment, this exposure beam source is a laser that generates the exposure beam 112 that is used to expose the media or plate 10. This exposure beam 112 is modulated at the plate 10, in order to selectively expose the plate 10 with the desired image.

In the present embodiment, the modulated exposure beam 112 is generated by modulating the laser source 110. In other embodiments, intervening modulators are used in order to generate the modulated exposure beam 112 from the continuous wave source.

A controller 114 is provided to control the laser source 110. This controller 114 provides both the modulation data to the laser source 110, which controls the generation of the modulated exposure beam, and a laser power setting 118. This controls the intensity of the exposure beam 112, typically by controlling the current to the diode laser or lasers in the laser source 110.

The controller 114 generates the modulation data by reference to an image data source 120. This stores the halftone image data that is to be rendered on the plate media 10.

The laser power setting 118 is stored in a power setting store 122. This controls the power setting for the laser source 110, and specifically the intensity of the exposure beam 112.

According to the present invention, an exposure map store 124 is further provided.

This map comprises image data for generating an exposure map and corresponding power settings. The controller 114 references the exposure map store 124 to generate an exposure map by control of both the data 116 and the laser power setting 118 that are provided to the laser source.

After the plate media 10 has been fully exposed, the plate 10 is transferred to a plate developer 150. Here, the plate 10 is chemically developed to render the desired image on the plate.

According to the present invention, after the plate developer 150, a post-development exposure level analyzer 152 is provided in the production line. This receives the developed plate prior to the plate being sent to the offset printing system 154. The post-development exposure level analyzer 152 analyzes the plate 10 and specifically, the exposure map, which is rendered on the plate. It analyzes the various regions of the exposure map on the plate media that are associated with the power settings to determine the optimum power setting for plate exposure. This information is transmitted to the controller 114, which updates the power setting store 122 with the new exposure data.

Figure 2:
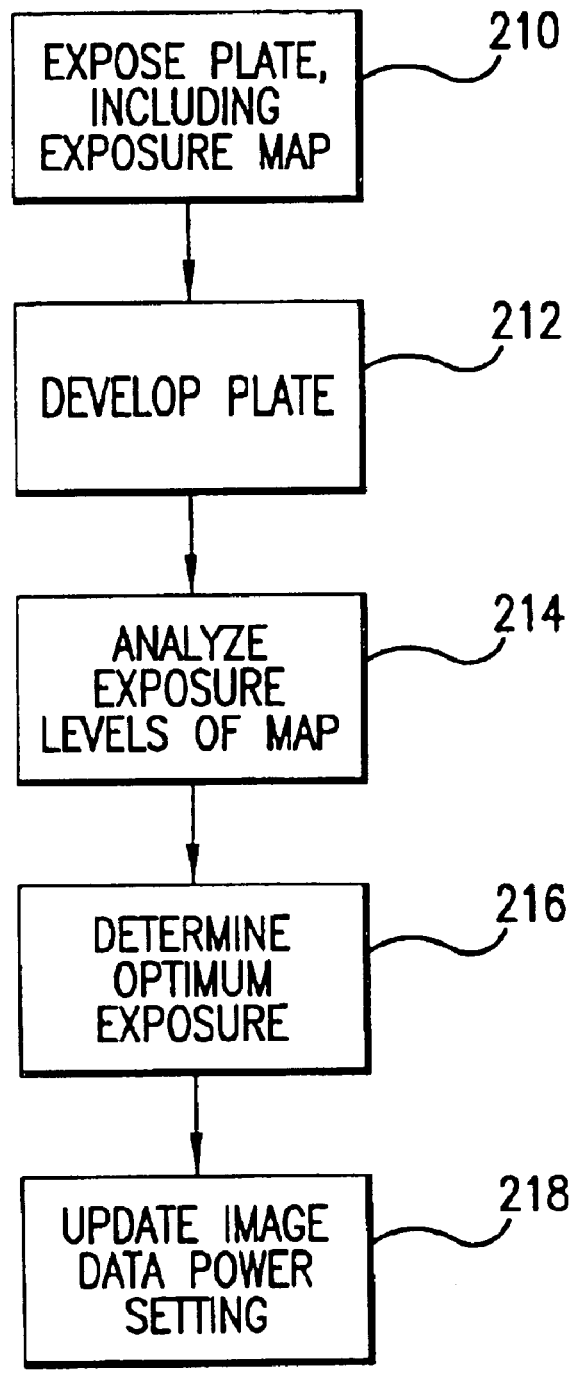
FIG. 2 is a flow diagram illustrating a method for controlling plate exposure in a plate production line.

FIG. 2 is a flow diagram showing a method for characterizing exposure levels in a platesetter. Specifically, plates are exposed in step 210. This exposure includes exposing a portion of the plate with an exposure map. This exposure map comprises regions that are exposed at different power settings. These are regions of solid exposure or half-tone patterns, or both.

Then, in step 212, the plate is developed. This includes developing both the printing area of the plate that holds the desired image and also the portion of the plate that has the exposure map.

Then, in step 214, the exposure map is analyzed to determine the proper exposure level from the map. It is common that exposure levels change with changes in the imaging engine.

Further, changes in plate chemistry due to, for example, aging of the plate, can also change the optimal exposure level. In step 214, the performance of the plate under different exposures, is analyzed to determine an optimum exposure in step 216. Then in step 218, the power setting for exposing the next plate is used, based on the analysis and determination in steps 214, 216.

In addition to changing the exposure, the data gathered by the post development analyzer 152 is used to alert the user to change the developer chemicals, or to make other changes to the imaging engine 100, the plate developer 150 or the printing press 154, whether in general or in reference to that particular plate.

Figure 3:
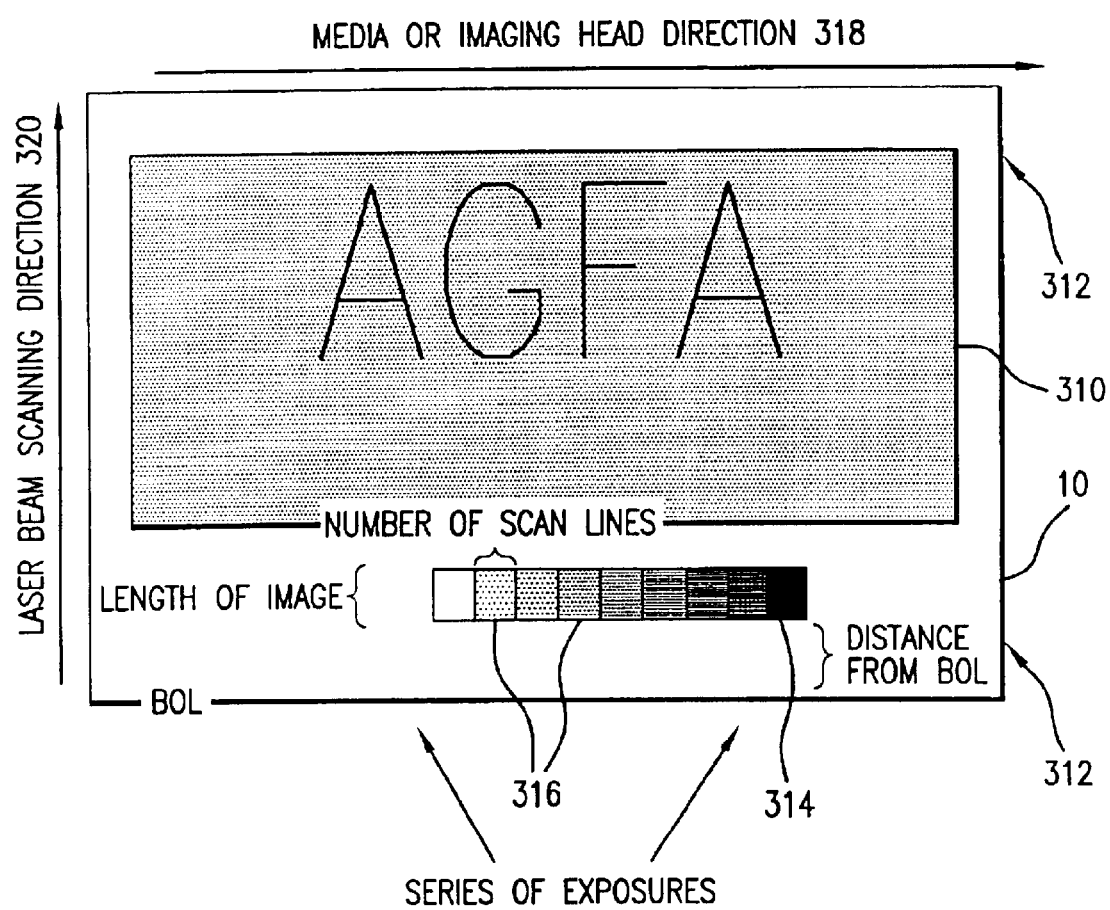
FIG. 3 is a schematic diagram of an exposed plate showing the printing area and the inventive exposure map.

FIG. 3 in a plan view of a plate 10, including an exposure map 314, according to the present invention.

Specifically, the plate 10 includes a printing area 310, which has the desired image that is to be printed in an offset printing system. This printing area 310 extends in a media or imaging head direction 318, which is the direction that the head moves as it moves relative to the plate 10, during the exposure process. The image also extends in the laser beam scanning direction 320, which is the direction in which the exposure beam is scanned, typically by a scanning mechanism, such as a rotating prism.

The imaging direction and the media direction can be interchangeable. Also sometimes the plate moves under the imaging head rather than the head moving over the plate, in other implementations.

According to the present invention, outside of the printing area 310, the exposure map 314 is placed. In one example, this is located in one of the gripper edges 312 that are on the periphery of the plate 10, and extends in the direction of the imaging head movement 318. Location of the exposure map 314 in this region, assures that the generation of the exposure map does not consume otherwise valuable regions of the plate 10, that could be used to generate the required images for printing.

The exposure map 314 comprises regions 316 that have been exposed with solid images and/or half-tone images. In the illustrated example, ten regions are used, but more or less regions can used depending on the required exposure precision and the range of exposure that is required.

The difference between the various regions 316 is that they have been exposed at different exposure levels and specifically, different exposure beam powers, in the current embodiment. Thus, the map 314 enables analysis of the plate 10 relative to the strength of the exposure beam 112 to determine the optimum exposure level.

FIG. 4 is a matrix illustrating exemplary exposure levels for the regions 316 of the exposure map 314 of FIG. 3. Specifically, the exposure map 314 comprises eight (8) levels or input values 1 through 8. These are exposed are various exposure levels relative to a maximum output power of the exposure beam 112. For example, input value 1 is exposed at 100% of the exposure beam's power, whereas region 4 is exposed at 36% of the exposure beam's power.

As illustrated by column three of the table, the exposure settings are log changes, relative to each other. This logarithmic scale is used because exposure changes as a function of the log of the beam power. However, the exposures can vary along other types of mapping and is not necessarily logarithmic, but in the preferred embodiment, it is logarithmic. Also, the mapping can be done in reverse order, or any other order or orientation, or placement, i.e., not stepped along a straight path, but possibly in a matrix or checkerboard fashion.

Further, the table of exposure values to which the laser is set to are pre-determined and downloaded to the engine in one implementation, or instead, the engine generates the table automatically using a built in exposure control system. This table can then be specific to the components of that particular imaging head or imaging engine 100 which is helpful when the imaging head or laser source is replaced. Also, this automatically generated table can be uploaded from the engine for reference.

Figure 5:
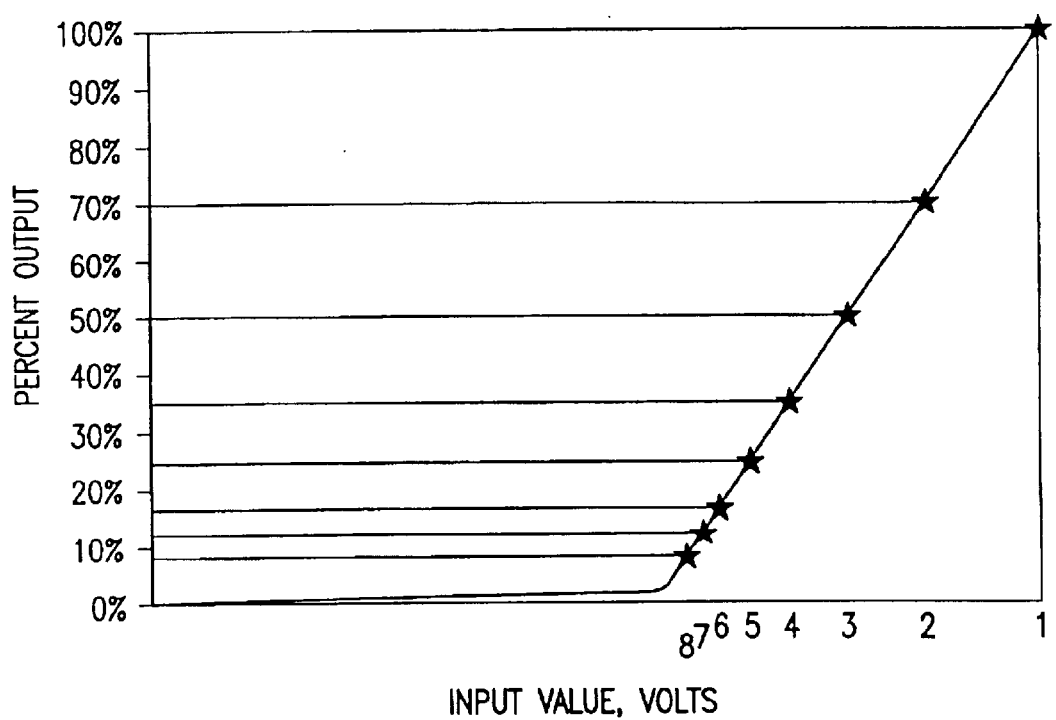
FIG. 5 is a plot showing how the level of laser power varies with the input voltage.

FIG. 5 is a plot of percent output as a function of input value from FIG. 4. For each of the input values 1 through 8, the output power changes between approximately 10% and 100%. The amount of input is adjusted to achieve specific amounts of laser power needed for a logarithmic exposure scale. These values are preferably stored in a look up table in the exposure map store 124.

Figure 6:
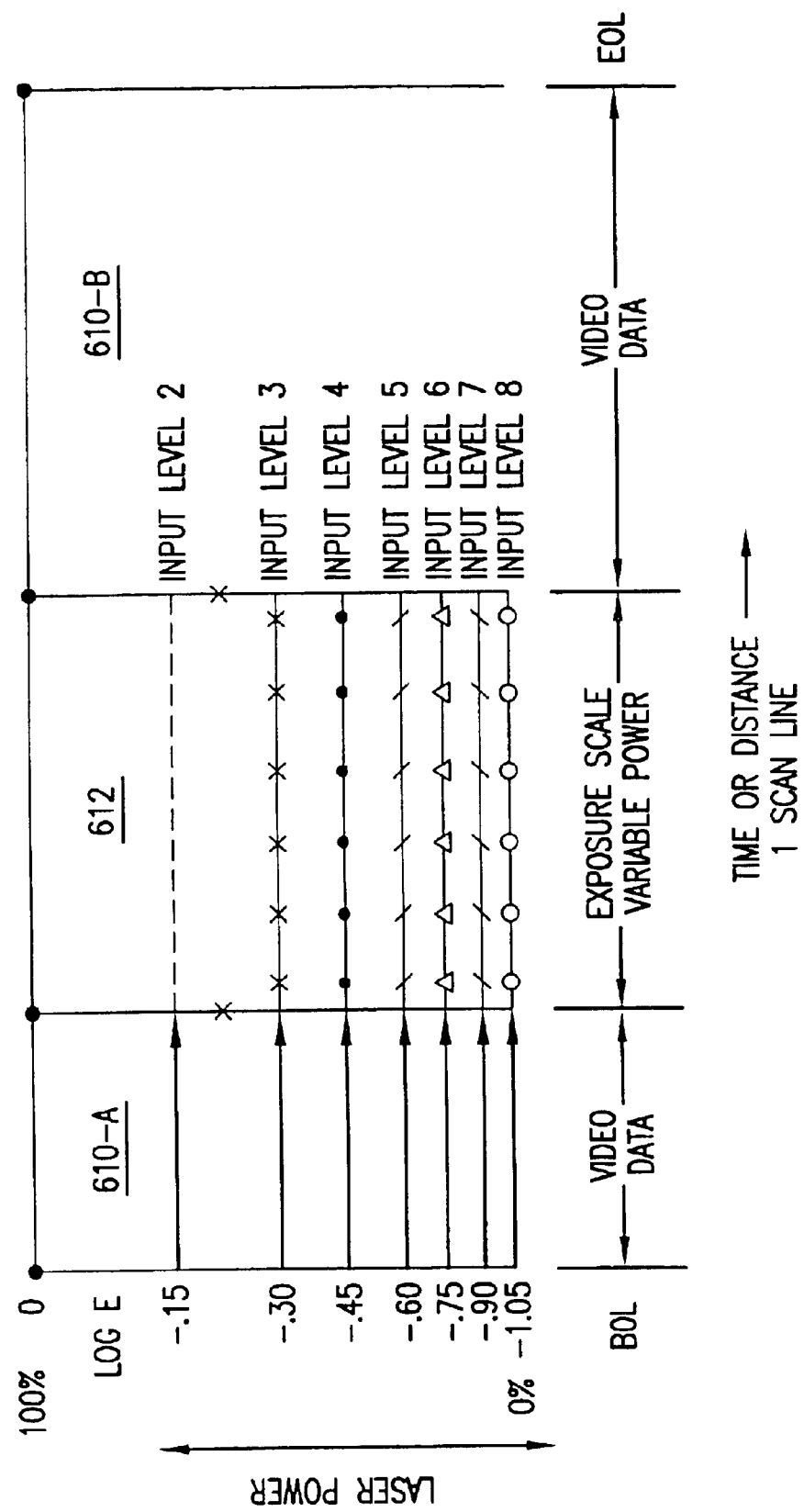
FIG. 6 is a schematic diagram showing the modulation of the laser power in order to produce the exposure map and the desired image of the printing area.

FIG. 6 is a plot showing how the laser power is modulated between the beginning of line (BOL) and the end of line (EOL). When the exposure map 314 extends in the imaging head direction 318 as shown in the FIG. 3 embodiment, the laser power is changed during the video speed scan.

Specifically, when the video data is generated during periods 610-A and 610-B of the scan, the selected laser power is determined by reference to the power setting in the power setting store 122. Then, when the exposure map region 612 of the scan is reached, the power is variable as determined with reference to the data stored in the exposure map store 124. In the current embodiment, the laser power modulates in a stair-step fashion during the scanning in region 612.

For different power settings are selected corresponding to each of the input levels, thereby modulating the power in a stair-step fashion.

While this invention has been particularly shown and described with references to preferred embodiments thereof, it will be understood by those skilled in the art that various changes in form and details may be made therein without departing from the scope of the invention encompassed by the appended claims. For example, in other embodiments, the exposure may 314 can be extended in the direction of beam scanning 320 in FIG. 3.

What is claimed is:

1. A method for characterizing exposure levels in a platesetter, the method comprising:

exposing regions of a plate at different exposure levels outside of a printing area by modulating a power of an exposure beam; and analyzing the plate after development to determine a desired exposure level for plates on the platesetter by reference to the regions receiving the different exposure levels.

2. A method as claimed in claim 1, wherein the step of exposing regions of the plate comprises exposing the plate at different exposure levels in a direction of imaging head movement.

3. A method as claimed in claim 1, wherein the step of exposing regions of the plate comprises exposing the plate along a gripper edge.

4. A method as claimed in claim 1, wherein the step of exposing regions of the plate comprises generating an exposure map.

5. A method as claimed in claim 1, wherein the step of generating the exposure map comprises generating log changes in exposure levels by controlling a current to a laser generating the exposure beam.

6. A method as claimed in claim 1, wherein the step of generating the exposure map comprises generating log changes in exposure levels by controlling an attenuator acting on the exposure beam.

7. A method as claimed in claim 1, wherein the step of generating the exposure map comprises generating regions including halftone patterns at different exposure levels.

8. An exposure characterization system for a platesetter, the system comprising:

an exposure beam generator for generating a modulated exposure beam for exposing a plate;

a controller for controlling the exposure beam generator to expose regions of the plate at different exposure levels by controlling a power of the exposure beam in a region outside of a printing area.

9. A system as claimed in claim 8, wherein the exposure beam generator comprises a modulated laser diode.

10. A system as claimed in claim 8, wherein the exposure beam generator comprises a laser source and an attenuator for controlling a power of the exposure beam delivered to the plate.

11. A system as claimed in claim 8, wherein the controller controls the exposure beam generator to expose the plate at different exposure levels in an area extending in a direction of imaging head movement.

12. A system as claimed in claim 8, wherein the controller controls the exposure beam generator to expose the plate at different exposure levels along a gripper edge.

13. A system as claimed in claim 8, further comprising an exposure map storage for storing exposure levels of an exposure map.

14. A system as claimed in claim 13, wherein the exposure map includes log changes in exposure levels.

15. A system as claimed in claim 8, wherein the exposure map includes regions including halftone patterns at different exposure levels.

16. A method for controlling plate exposure in a plate production line, the method comprising:

exposing regions of plates at different exposure levels in areas outside of printing areas of the plates; and analyzing the plates after development to determine desired exposure levels for the plates on the platesetter by reference to the regions receiving the different exposure levels; and feeding back changes in an exposure level for the printing areas of plates in the platesetter.

17. A method as claimed in claim 16, wherein the step of exposing regions of the plates comprises exposing the plates along a gripper edge.

18. A method as claimed in claim 16, wherein the step of exposing regions of the plates comprises generating exposure maps on the plates.

19. A method as claimed in claim 16, wherein the step of generating the exposure maps comprises generating log changes in exposure levels by controlling a current to a laser generating an exposure beam.

20. A method as claimed in claim 16, wherein the step of generating the exposure map comprises generating log changes in exposure levels by controlling an attenuator acting on an exposure beam.

21. A method as claimed in claim 16, wherein the step of generating the exposure maps comprises generating regions including halftone patterns at different exposure levels.

22. A plate exposure level control system, comprising:

an exposure beam generator for generating a modulated exposure beam for exposing plates;

a controller for controlling the exposure beam generator to expose regions of the plates at different exposure levels by controlling a power of the exposure beam;

a post development analyzer for analyzing the plates after development to determine a desired exposure level for plates on the platesetter by reference to the regions receiving the different exposure levels and feeding back changes in an exposure level for the printing areas of plates in the platesetter.

23. A system as claimed in claim 22, wherein the exposure beam generator comprises a modulated laser diode.

24. A system as claimed in claim 22, wherein the exposure beam generator comprises a laser source and an attenuator for controlling a power of the exposure beam delivered to the plate.

25. A system as claimed in claim 22, wherein the controller controls the exposure beam generator to expose the plate at different exposure levels in an area outside of a printing area.

26. A system as claimed in claim 22, wherein the controller controls the exposure beam generator to expose the plates at different exposure levels along a gripper edge.

27. A system as claimed in claim 22, further comprising an exposure map storage for storing exposure levels of an exposure map.

28. A system as claimed in claim 27, wherein the exposure map includes generating log changes in exposure levels.

29. A system as claimed in claim 27, wherein the exposure map includes regions including halftone patterns at different exposure levels.

* * * * *